(12) United States Patent
Horch et al.

(10) Patent No.: US 7,320,895 B1
(45) Date of Patent: Jan. 22, 2008

(54) THYRISTOR-BASED DEVICE HAVING DUAL CONTROL PORTS

(75) Inventors: Andrew Horch, Sunnyvale, CA (US); Scott Robins, San Jose, CA (US); Farid Nemati, Menlo Park, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 316 days.

(21) Appl. No.: 11/086,113

(22) Filed: Mar. 22, 2005

Related U.S. Application Data

(62) Division of application No. 10/288,953, filed on Nov. 6, 2002, now Pat. No. 6,965,129.

(51) Int. Cl.
*H01L 21/00* (2006.01)
*H01L 21/332* (2006.01)

(52) U.S. Cl. .............. 438/5; 438/138; 257/E21.529

(58) Field of Classification Search .......... 438/138; 257/E21.529, E21.531
See application file for complete search history.

(56) References Cited

U.S. PATENT DOCUMENTS

| | | | |
|---|---|---|---|
| 3,664,942 A * | 5/1972 | Havas et al. ........... | 204/192.33 |
| 3,943,549 A | 3/1976 | Jaecklin et al. | |
| 4,031,412 A | 6/1977 | Ohhinata et al. | |
| 4,032,955 A | 6/1977 | Anthony et al. | |
| 4,612,448 A | 9/1986 | Strack | |
| 4,672,410 A | 6/1987 | Miura et al. | |
| 4,673,962 A | 6/1987 | Chatterjee et al. | |
| 4,677,455 A | 6/1987 | Okajima | |
| 4,734,384 A | 3/1988 | Tsuchiya | |
| 4,829,357 A | 5/1989 | Kasahara | |
| 4,833,516 A | 5/1989 | Hwang et al. | |
| 4,864,168 A | 9/1989 | Kasahara et al. | |

(Continued)

FOREIGN PATENT DOCUMENTS

| | | |
|---|---|---|
| FR | 2110326 | 6/1972 |
| JP | 57208177 | 12/1982 |
| JP | 05235332 A | 9/1993 |
| WO | WO-99/63598 | 12/1999 |
| WO | WO-2073695 A2 | 9/2002 |

OTHER PUBLICATIONS

Christopher J. Petti and James D. Plummer, The Field-Assisted Turn-Off Thyristor: A Regenerative Device with Voltage-Controlled Turn-Off, Aug. 1992.

(Continued)

*Primary Examiner*—Lex Malsawma

(57) ABSTRACT

Switching operations, such as those used in memory devices, are enhanced using a thyristor-based semiconductor device adapted to switch between a blocking state and a conducting state. According to an example embodiment of the present invention, a thyristor-based semiconductor device includes a thyristor having first and second base regions coupled between first and second emitter regions, respectively. A first control port capacitively couples a first signal to the first base region, and a second control port capacitively couples a second signal to the second base region. Each of the first and second signals have a charge that is opposite in polarity, and the opposite polarity signals effect the switching of the thyristor at a lower power, relative to the power that would be required to switch the thyristor having only one control port. In this manner, power consumption for a switching operation can be reduced, which is useful, for example, to correspond with reduced power supplied to other devices in a semiconductor device employing the thyristor.

9 Claims, 8 Drawing Sheets

U.S. PATENT DOCUMENTS

| | | | |
|---|---|---|---|
| 4,959,703 | A | 9/1990 | Ogura et al. |
| 4,982,258 | A | 1/1991 | Baliga |
| 5,034,785 | A * | 7/1991 | Blanchard .................. 257/330 |
| 5,099,300 | A | 3/1992 | Baliga |
| 5,106,776 | A | 4/1992 | Shen et al. |
| 5,202,750 | A | 4/1993 | Gough |
| 5,252,845 | A | 10/1993 | Kim et al. |
| 5,283,456 | A | 2/1994 | Hsieh et al. |
| 5,321,285 | A | 6/1994 | Lee et al. |
| 5,324,966 | A | 6/1994 | Muraoka et al. |
| 5,390,145 | A | 2/1995 | Nakasha et al. |
| 5,396,454 | A | 3/1995 | Mowak |
| 5,412,598 | A | 5/1995 | Shulman |
| 5,463,344 | A | 10/1995 | Temple |
| 5,464,994 | A | 11/1995 | Shinohe et al. |
| 5,528,062 | A | 6/1996 | Hsieh et al. |
| 5,543,652 | A | 8/1996 | Ikeda et al. |
| 5,641,694 | A | 6/1997 | Kenney |
| 5,689,458 | A | 11/1997 | Kuriyama |
| 5,705,835 | A | 1/1998 | Nishiura et al. |
| 5,821,549 | A | 10/1998 | Talbot et al. |
| 5,874,751 | A | 2/1999 | Iwamuro et al. |
| 5,910,738 | A | 6/1999 | Shinohe et al. |
| 5,914,503 | A | 6/1999 | Iwamuro et al. |
| 5,936,267 | A | 8/1999 | Iwamuro |
| 5,939,736 | A | 8/1999 | Takahashi |
| 5,981,984 | A | 11/1999 | Iwaana et al. |
| 6,081,002 | A | 6/2000 | Amerasekera et al. |
| 6,210,981 | B1 | 4/2001 | Birdsley et al. |
| 6,225,165 | B1 | 5/2001 | Noble, Jr. et al. |
| 6,229,161 | B1 | 5/2001 | Nemati et al. |
| 6,258,634 | B1 | 7/2001 | Wang et al. |
| 6,281,025 | B1 | 8/2001 | Ring et al. |
| 6,391,689 | B1 | 5/2002 | Chen |
| 6,448,586 | B1 | 9/2002 | Nemati et al. |
| 6,462,359 | B1 | 10/2002 | Nemati et al. |
| 6,472,693 | B1 | 10/2002 | Takahashi et al. |
| 2001/0024841 | A1 | 9/2001 | Noble, Jr. et al. |
| 2002/0093030 | A1 | 7/2002 | Hsu et al. |
| 2002/0096690 | A1 | 7/2002 | Nemati et al. |
| 2002/0100918 | A1 | 8/2002 | Hsu et al. |

OTHER PUBLICATIONS

Plummer, James, D. and Scharf, Brad, W., Insulated-Gate Planar Thyristors: I-STructure and Basic Operation, pp. 380-386, Feb. 1980.

S. M. Sze, Physics of Semiconductor Devices, Second Edition, John Wiley & Son, pp. 198-209, 1981.

Ponomarev, Y.V., Stolik, P.A. Salm, C., Schmitz, J., and Woerlee, P.H., High-Performance Deep SubMicron CMOS Technologies with Polycrystalline-SeGe Gates, IEEE Transactions on Electronic Devices, vol. 47, No. 4, p. 848-855.

Ponomarev et al., A 0.13 um Poly-SiGe Gate CMOS Technology for Low-Voltage Mixed-Signal Applications, IEEE Transactions on Electronic Devices, vol. 47, No. 7, pp. 1507-1513, Jul. 2000.

Ponomarev, Y.V., Schmitz, J., Woerlee, P.H., Stolk, P.A., and Gravesteijn, D.J., Gate-Workfunction Engineering Using Poly-(Se, Ge) for High Performance 0.18 um CMOS Technology, IEDM Tech. Dig., pp. 829-832, 1997.

Gribnikov, Z.S., Korobov, V.A., and Mitin, V.V., The Tunnel Diode As A Thyristor Emitter, Solid-State Electronics, vol. 42, No. 9, pp. 1761-1763.

Baliga, B. Jayant, Modern Power Devices, pp. 349-350, 1987.

Digh Hisamoto, Wen-Chin Lee, Jakub Kedzierski, Hideki Takeuchi, Kazuya Asano, Charles Kuo, Erik Anerson, Tsu-Jae King, Jeffrey Bokor and Chenming Hu, FinFET-A Self-Aligned Double-Gate MOSFET Scalable to 20 nm, Dec. 2000.

Xuejue Huang, Wen-Chin Lee,Charles Kuo, Digh Hisamoto, Leland Chang, Jakub Kedzierski, Erik Anderson, Hideki Takeuchi, Yang-Kyu Choi, Kazuya Asano, Vivek Subramanian, Tsu-Jae King, Jeffrey Bokor and Chenming Hu, Sub 50-nm FinFET; PMOS, Sep. 1999.

K. DeMeyer, S. Kubicek and H. van Meer, Raised Source/Drains with Disposable Spacers for sub 100 nm CMOS Technologies, Extended Abstracts of International Workshop on Junction Technology 2001.

Mark Rodder and D. Yeakley, Raised Source/Drain MOSFET with Dual Sidewall Spacers, IEEE Electron Device Letters, vol. 12, No. 3, Mar. 1991.

Yang-Kyu Choi, Daewon Ha, Tsu-Jae King and Chenming Hu, Nanoscale Ultrathin PMOSFETs with Raised Selective Germanium Source/Drain, IEEE Electron Device Letters, vol. 22, No. 9, Sep. 2001.

N. Lindert, Y. K. Choi, L. Chang, E. Anderson, W. C. Lee, T. J. King. J. Bokor, amd C. Hu, Quasi-Planar FinFETs with Selectively Grown Germanium Raised Source/Drain, 2001 IEEE International SOI Conference, Oct. 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, High Performance RF Characteristics of Raised Gate/Source/Drain CMOS with Co Salicide, 1998 Symposium on VLSI Technology Digest of Technical Papers, 1998.

Hsiang-Jen Huang, Kun-Ming Chen, Tiao-Yuan Huang, Tien-Sheng Chao, Guo-Wei Huang, Chao-Hsin Chien, and Chun-Yen Chang, Improved Low Temperature Characteristics of P-Channel MOSFETs with Si1-xGex Raised Source and Drain, IEEE Transactions on Electron Devices, vol. 48, No. 8, Aug. 2001.

Nemati, Farid, and Plummer, James, D., "A Novel High Density, Low voltage SRAM Cell with a Vertical NDR Device," VLSI Technology Technical Digest, Jun. 1998.

Stanley Wolf Ph.D. and Richard N. Tauber Ph.D., Silicon Processing for the VLSI Era, vol. 1, 1986, p. 285-286.

Nemati, Farid, and Plummer, James, D., "A Novel Thyristor-Based SRAM Cell (T-RAM) for High Speed, Low Voltage, Giga-Scale Memories," International Electron Device Meeting Technical Digest, 1999.

Digh Hisamoto, Toru Kaga and Eiji Takeda, Impact of the Vertical SOI "DELTA" Structure on Planar Device Technology. Jun. 1991.

* cited by examiner

THYRISTOR-BASED DEVICE HAVING DUAL CONTROL PORTS

FIELD OF THE INVENTION

This is a divisional of patent application Ser. No. 10/288,953 filed Nov. 6, 2002 now U.S. Pat. No. 6,965,129. This patent application is incorporated herein by reference.

The present invention is directed to semiconductor devices and, more specifically, to semiconductor devices including thyristor-based devices, such as thyristor-based memory devices and other thyristor-based current-switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has also become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region.

NDR devices including thyristors are also widely used in power switching applications because the current densities carried by the devices can be very high in their on state. The performance of such NDR devices is dependent upon many parameters, including the ability of the device to switch between a pass state and a blocking state in response to a voltage being applied to the thyristor. In a variety of applications, the supply voltage for devices, such as those including MOSFET and/or other transistor types, is reduced to meet corresponding reductions in feature sizes. When thyristor-based devices are used in connection with such MOSFET devices, however, their operating parameters do not necessarily scale with gate oxide thickness in the manner that MOSFET electrical parameters do. More specifically, as MOSFET features are scaled smaller, the corresponding voltage required to operate the devices is decreased. For thyristor-based devices, the voltage required to operate the device does not necessarily follow the reduced voltage required by the MOSFET devices. This results in a difference in operating voltage among different devices in a circuit, and as such may require modification of the circuit and/or the operation of the devices in order to achieve proper operation.

The above-mentioned and other difficulties associated with the operation of thyristor-based devices have presented and continue to present challenges to the manufacture and implementation of such devices.

SUMMARY

The present invention is directed to a semiconductor device that addresses the above-mentioned challenges. The present invention is exemplified in a number of implementations and applications, some of which are summarized below.

According to an example embodiment of the present invention, a semiconductor device includes a thyristor having at least two control ports coupled to a base region of the thyristor. The thyristor includes first and second base regions coupled between first and second emitter regions. A first control port is adapted to capacitively couple a first signal at least to the first base region and a second control port is adapted to capacitively couple a second signal at least to the second base region. The thyristor is adapted to switch between a blocking state and a conducting state (e.g., between high and low resistance states) in response to one or more of the capacitively coupled signals.

According to another example embodiment of the present invention, the first and second control ports of the thyristor discussed above are adapted to provide signals that are opposite in polarity. The thyristor device is adapted to switch between a blocking state and a conducting state in response to the opposite capacitively coupled signals. In this manner, the voltage required to switch the thyristor device is reduced, making possible the switching of the thyristor at lower power levels and addressing needs including those discussed above.

According to a more particular example embodiment of the present invention, a semiconductor device includes a memory cell having a thyristor in series with a pass device and having word lines coupled to first and second base regions of the thyristor. The pass device includes a transistor having a gate forming a first word line and a source/drain region that is coupled to an emitter region of the thyristor. The thyristor includes a first emitter region, a first base region coupled to the first emitter region, a second emitter region that is coupled to the pass device and a second base region coupled between the first base region and the second emitter region. A first thyristor control port forms a second word line and is adapted to capacitively couple a first signal to the first base region. A second thyristor control port forms a third word line and is adapted to capacitively couple a second signal to the second base region, the first and second control ports being adapted to supply signals to the base regions that are opposite in charge. In response to the opposite signals, the thyristor device is adapted to switch between a blocking state and a conducting state for storing and manipulating data in the memory cell as a function of the conductance state of the thyristor device. Optionally, the semiconductor device also includes a circuit controller adapted for applying one or more signals to one or more portions of the memory cell, such as word lines, bit lines and Vref lines thereof.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
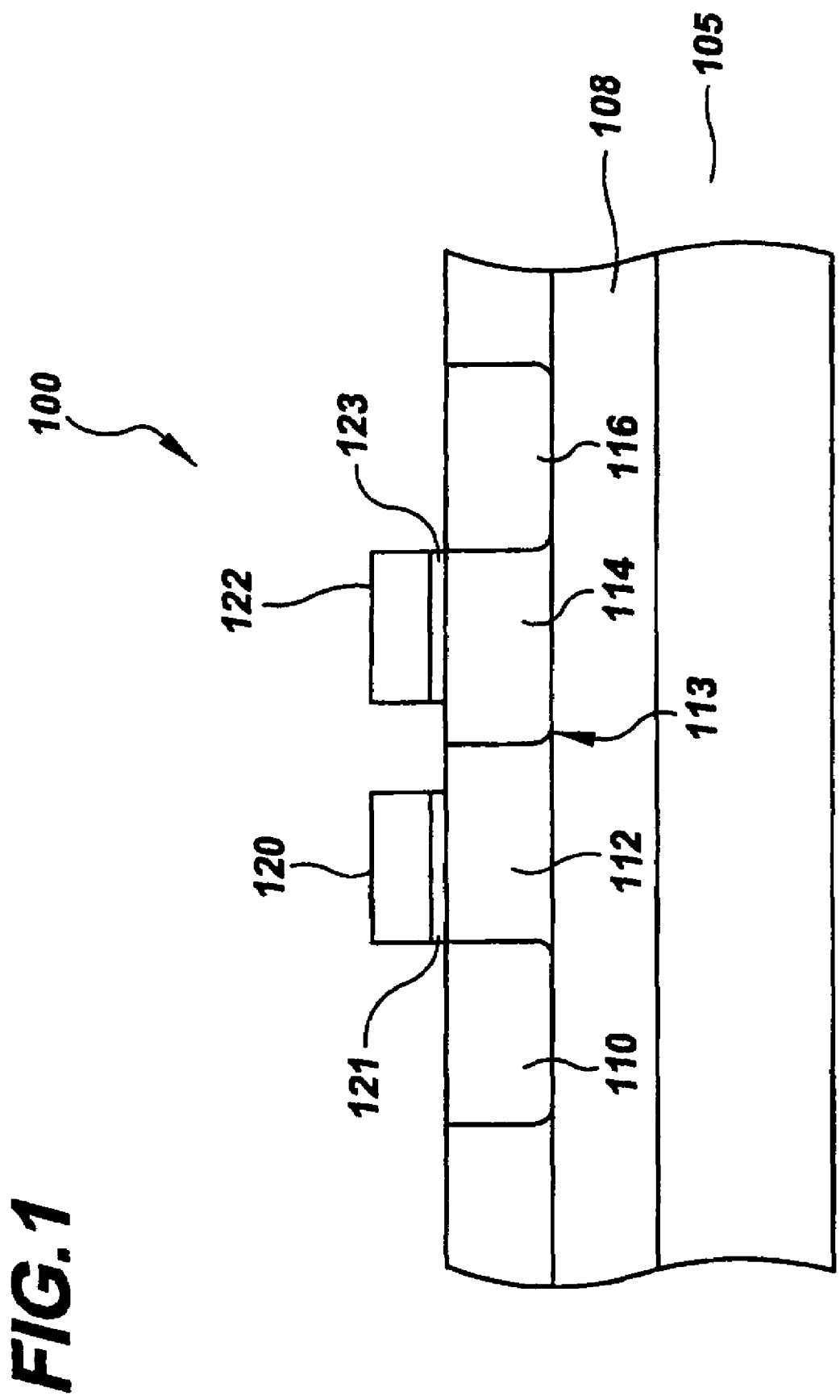
FIG. 1 is a thyristor-based semiconductor device, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices using thyristor-based devices (i.e., thyristor-including devices), such as memory cells and switching circuits, and for enhancing the ability to form such devices. While the present invention is not necessarily limited to such devices, various aspects of the invention may be appreciated through a discussion of various examples using this context.

According to an example embodiment of the present invention, a semiconductor device includes a thyristor having a first control port coupled to a first base region and a second control port coupled to a second base region. Each of the first and second control ports are adapted for providing signals to the first and second base regions, respectively, to switch the thyristor between a blocking state and a conducting state in response to one or more of the signals. In one implementation, the first and second control ports are adapted for concurrently providing signals for switching the thyristor between a blocking state and a conducting state. In another implementation, the signals provided from each control port are opposite in polarity, and the thyristor is adapted to switch between a blocking state and a conducting state in response to the oppositely-charged signals. With this approach involving the use of two control ports and/or oppositely-charged signals, the thyristor is switched using signals having a lower voltage level than would be needed to switch the thyristor, without the second signal. For example, absent one of the control ports, the other one of the control ports would be biased at a higher voltage level in order to switch the thyristor. The reduced voltage results in a reduction in the amount of power required to switch the thyristor between blocking and conducting states.

In another implementation, angled implantation is used to form one or more body regions of the thyristor, such as the base regions to which the first and/or second control ports are capacitively coupled. The angled implant uses a mask-type material over a substrate, such as a control port, spacer or dielectric material, to mask a portion of the substrate. The angle of the implant is selected to achieve a desired alignment of the region being implanted, relative to the mask-type material. With this approach, the alignment of junctions between regions is controllable. For instance, using the second control port as a mask, an angled implant can be used to create a junction between adjacent body regions that is overlapped by the second control port. Furthermore, this approach is applicable to the angled implant of body regions in bulk substrate and other arrangements, such as siliconon-insulator (SOI) arrangements, with the angled implant being carried out in the silicon portion of SOI structure.

FIG. 1 shows a thin capacitively-coupled thyristor-type semiconductor device 100 having a thyristor with control ports coupled to two base regions over a buried oxide 108, and underlying substrate 105, according to another example embodiment of the present invention. The thyristor includes first and second emitter regions 110 and 116 coupled to first and second base regions 112 and 114, respectively. A first control port 120 is capacitively coupled to the first base region 112 via a dielectric 121, and a second control port 122 is capacitively coupled to the second base region 114 via a dielectric 123. As shown, the second control port 122 underlaps a junction 113 between the first and second base regions 112 and 114 (e.g., the second control port 122 is not over the junction 113). The first and second control ports are adapted to supply signals having opposite polarity that cause the thyristor to switch from a blocking state to a conducting state or from a conducting state to a blocking state.

The opposite polarity signals can be applied in a variety of manners. For instance, when the control port 122 supplies a positive going voltage to the second base region 114, the control port 120 supplies a negative going voltage to the first base region 112. The first and second base regions are adapted to pass a signal between the first and second emitter regions 110 and 116 (e.g., for storing data relating to a state of the second emitter region) in response to the signals.

In a more particular example embodiment of the present invention, at least one of the control ports that is capacitively coupled to the respective base regions of the thyristor is used as a word line. This word line control port is doped in a manner that achieves a workfunction defined by the relationship of the control port and the base region such that the voltage required to be applied to the word line to operate the thyristor is reduced. In one implementation, the polysilicon gate capacitively coupled to the n-base region is degenerately doped (e.g., heavily doped to a concentration that is well above the metal-insulator transition point for semiconducting material) using a dopant such as Boron to achieve a gate workfunction of about 5.2 eV. In another implementation, the polysilicon gate capacitively coupled to the p-base region is degenerately doped with Phosphorous to achieve a gate workfunction of about 4.1 eV. By doping in this manner, the amount of voltage that must be supplied to the gate in order to cause the thyristor to switch between the blocking and conducting states is reduced significantly. The equations discussed and shown in connection with the paragraph below show an example relationship between the threshold voltage (Vt) and work function, in connection with one or more example embodiments in the present invention.

In another implementation, the doping of the word line (e.g., the control port) is selectively doped to either n type or p type to achieve a desired Vt of a parasitic MOSFET (an inversion channel formed below the thyristor control port). In one implementation, the Vt of the parasitic MOSFET is made large enough such that it inhibits and/or prevents an inversion channel from forming in the device (e.g., during an "off" state). One method for increasing the VT is to change the workfunction difference between the gate material and the channel region. The relationship between Vt and work function difference ($\phi_{ms}$) is given be the following equations:

$$V_T = \phi_{ms} - (Q_f/C_i) + 2\psi_B + (4\in_s q N_A \psi_B)^{1/2}/C_i; \text{ where}$$

$$\phi_{ms} = \psi_m - (\chi + E_g/2q + \psi_s);$$

$\phi_m$ is the gate workfunction;
($\chi + E_g/2q + \psi_s$) is the channel region workfunction;
$\chi$ is the electron affinity of the substrate;
$E_g$ is the energy bandgap;
q is the magnitude of electric charge;
$\psi_s$ is the electrostatic potential of the surface;
$Q_f$ is the fixed surface charge;
$C_i$ is the capacitance per unit area;
$\psi_B$ is the potential difference between the Fermi level and the intrinsic Fermi level;
$\in_s$ is the permittivity of the silicon; and
$N_A$ is the substrate doping.

The channel region workfunction is independent of the gate workfunction. In one implementation, the control port is doped using a separate implant step and in another implementation, the control port is doped during an implant step for other portions of the semiconductor device. For more information regarding $V_T$, and other aspects of semiconductor devices to which the present invention is applicable reference may be made to "Physics of Semiconductor Devices $2^{nd}$ Edition" by S. M. Sze, A Wiley-Interscience Publication, 1981, page 442. In addition, for more information regarding the inhibition of undesirable current flow at a region immediately adjacent to the control port, reference may be made to U.S. patent application Ser. No. 10/263,382, entitled "Thyristor-based Device Adapted to Inhibit Parasitic Current," now U.S. Pat. No. 6,686,612, filed Oct. 1, 2002.

The gate may employ voltage levels that are significantly higher than what typical logic MOSFET devices can tolerate. If voltages greater than that used for standard logic devices in a semiconductor device in which the thin capacitively-coupled thyristor is formed are used, special high voltage devices may need to be manufactured in the process, absent the dual control port of the present invention. These high voltage devices can significantly increase the complexity of the manufacturing process for semiconductor devices in which they are formed. By minimizing the voltage needed on the control ports for the thyristor, the manufacturing process is simplified by reducing and/or eliminating the need for such high voltage devices.

Various ones of the example embodiments described below in connection with the figures share similar features with each other and with FIG. 1. In connection with each of these figures, certain discussion of similar features (that are similarly numbered) is omitted for brevity.

Figure 2:
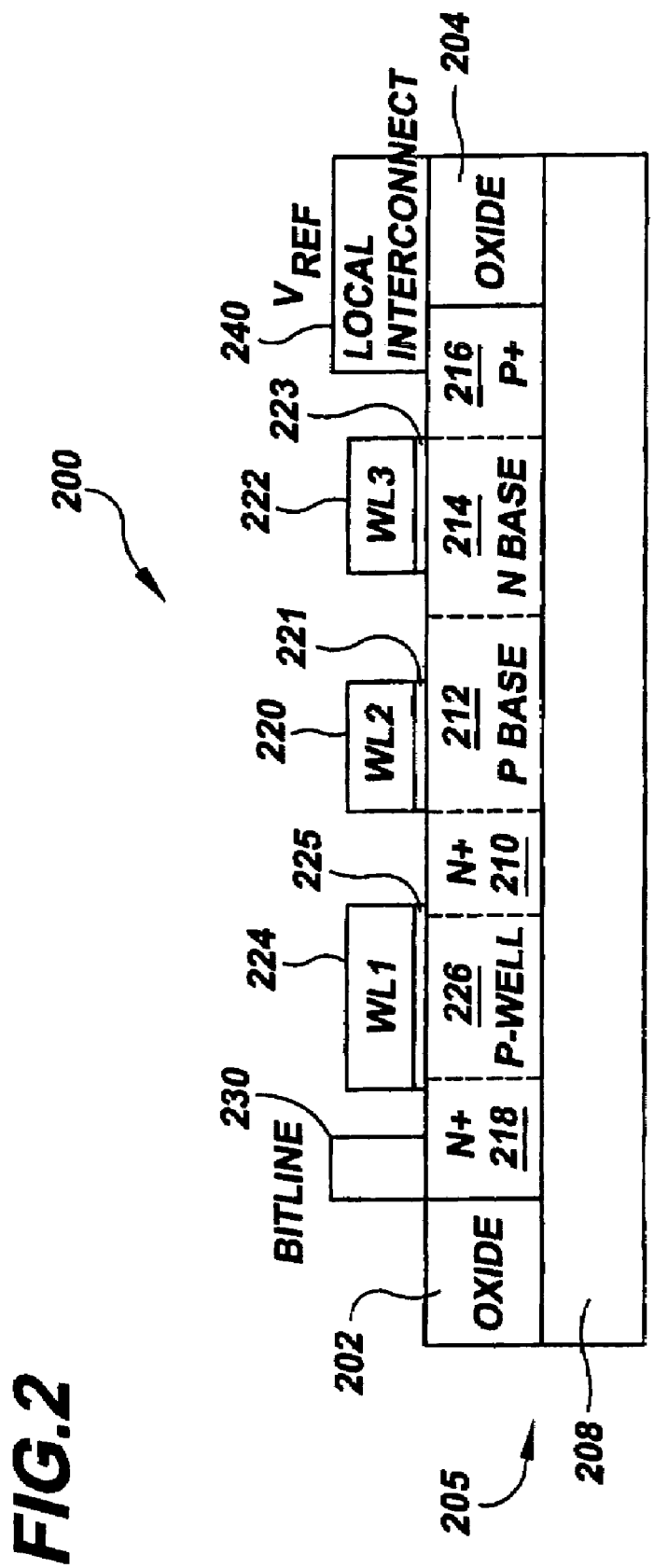
FIG. 2 is a thyristor-based device coupled to a pass device, according to another example embodiment of the present invention.

FIG. 2 shows a thyristor-based semiconductor device 200 having SOI structure, according to a more particular example embodiment of the present invention. The device 200 includes a thyristor having N+ emitter region 210, P base region 212, N base region 214 and P+ emitter region 216. The thyristor regions are formed in a variety of manners, such as using polysilicon doped to achieve the respective polarity/dopant type, depending on the implementation. The P+ emitter 216 and the N base 214 form an anode end portion of the thyristor, and the N+ emitter 210 and the P base region 212 form a cathode end portion of the thyristor. A thyristor gate 220 (e.g., a polysilicon gate) is capacitively coupled to the P base region 212 via dielectric 221, and another thyristor gate 222 is capacitively coupled to the N base region 214 via dielectric 223 (e.g., oxide). A pass device includes source/drain regions 218 and 210 (which also is an emitter for the thyristor) and a gate 224 capacitively coupled to a P-well region 226. The source/drain region 218 is coupled to a bit line 230, and the P+ emitter region 216 is coupled to an interconnect 240 that is adapted to carry a reference voltage (Vref). The pass device and the thyristor are built over an insulator portion 208 of the SOI structure and are insulated from other circuitry in the device by oxide isolation regions 202 and 204.

Gate 224 is part of a first word line (WL1), gate 220 is part of a second word line (WL2) and gate 222 is part of a third word line (WL3) of the device 200. Each of the gates 220 and 222 are adapted to apply a signal (e.g., a voltage pulse) to the base regions 212 and 214. The signal applied at each gate is opposite in polarity relative to the signal applied to the other gate (e.g., when the voltage at WL3 is positive, the voltage at WL2 is negative). The thyristor device is adapted to switch between a blocking state and a conducting state in response to the opposite polarity signals at WL2 and WL3.

Figure 3:
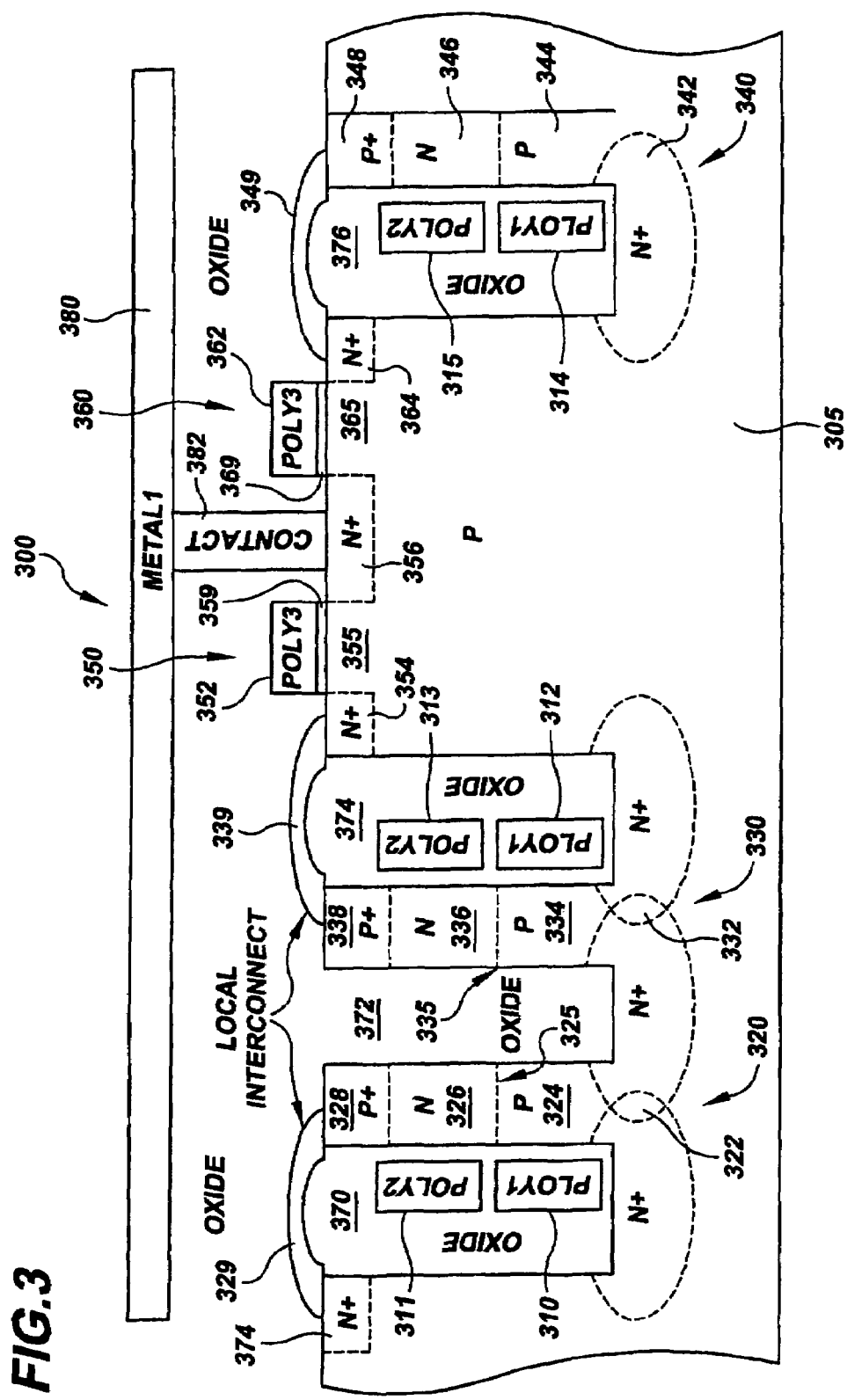
FIG. 3 is a thyristor-based memory cell, according to another example embodiment of the present invention.

FIG. 3 shows a thyristor-based semiconductor device 300 showing a combination of an n-FET pass gate and a cathode down thyristor, according to another example embodiment of the present invention. Three thyristors including body regions 320, 330 and 340 are shown, each having similarly-numbered regions (e.g., P base portion 334 corresponds to P base portions 324 and 344). In this regard, thyristor 330 and related portions of the device 300 will be described in detail, with the intent that the description may also be applied to thyristors including body regions 320 and 340 and the portions of the device related thereto. The thyristors are formed vertically in bulk substrate 305 of the device and are electrically insulated from other portions of the device by trench regions 370, 372, 374 and 376, each including an insulative material such as oxide. The thyristor 330 includes an emitter region 332, shown as including two N+ doped regions below the oxide trenches 372 and 374. A P base region 334 is adjacent to the emitter 332 and an N base region 336, which is also adjacent to a P+ doped emitter region 338. The N+ emitter region 332 and P base region 334 make up a cathode end portion of the thyristor, and the P+ emitter region 338 and the N base region 336 make up an anode end portion of the thyristor.

The thyristors are electrically coupled to a reference voltage (Vref) and in series with pass devices, and each base region is coupled to a control port. Referring again to the thyristor 330, two thyristor control ports 312 and 313 are coupled to each of the base regions 334 and 336, respectively, and are adapted to provide the base regions with a signals that are opposite in polarity, respective to one another. The N+ cathode emitter 332 is coupled to Vref (not shown), and the P+ anode emitter 338 is coupled in series with a pass device 350. The pass device includes source/drain regions 354 and 356 having an N+ doping, and a gate 352 that is capacitively coupled to a channel region 355 via a gate dielectric 359. The source/drain region 354 is coupled to the P+ emitter region 338 via an interconnect 339. The source/drain region 356 is coupled via a contact 382 to an interconnect 380 (Metal 1). In one memory implementation, the gate 352 is part of a first word line (WL1), control port 313 is part of a second word line (WL2), control port 312 is part of a third word line (WL3), and the Metal 1 interconnect 380 is part of a bit line.

In another example embodiment, the semiconductor device 300 is manufactured such that one or more the control ports 310, 312 and 314 are aligned to a junction between adjacent base regions. Using control port 312 as an example, the junction 335 between base regions 334 and 336 is aligned to the control port 312 during the manufacture of the device 300. For example, polysilicon is first filled in the trench 374 and then etched to a depth that is about aligned to the junction 335, with the etched polysilicon forming the control port 312. In one implementation, a characteristic of the semiconductor device 300 is detected during the etching, with the detected characteristic used to indicate that the polysilicon has been etched to a depth such that it is about aligned to the junction 335. In another implementation, material sputtered from the device 300 is detected during the etching of the polysilicon, with the etching being terminated as a function of detecting that sputtered material corresponds to a junction between the base regions 334 and 336. In various other implementations, characteristics such as emissions (e.g., photons or electrons) from the semiconductor device 300 and/or electrical responses of the device 300 are used to detect that the control port 312 is aligned to the junction 335 during an etch process. With these approaches, difficulties associated with alignment of the control ports (e.g., due to previous inability to detect the junctions) are addressed.

In another implementation, a dummy thyristor is etched concurrently with the polysilicon used to form control port 312, wherein a junction in the dummy thyristor corresponds to a junction in the thyristor body 330. Using thyristor body 320 as an example dummy region, a junction 325 is at about the same depth in the semiconductor device 300 as the junction 335. As the thyristor body 320 and the polysilicon used to form the control port 312 are etched, sputtered material from the thyristor body 320 is detected. When a change in the composition of the sputtered material from N-type to P-type is detected, the junction 325 is correspondingly detected and the etching is stopped in response thereto. With this approach, the control port 312 is about aligned to the junction 335. For general information regarding semiconductor devices, and for specific information regarding etching approaches that may be implemented in connection with one or more example embodiments of the present invention, reference may be made to U.S. Pat. Nos. 5,821,549 (Talbot et al.), 6,210,981 (Birdsley et al.) and 6,281,025 (Ring et al.), which are fully incorporated by reference.

Figure 4:
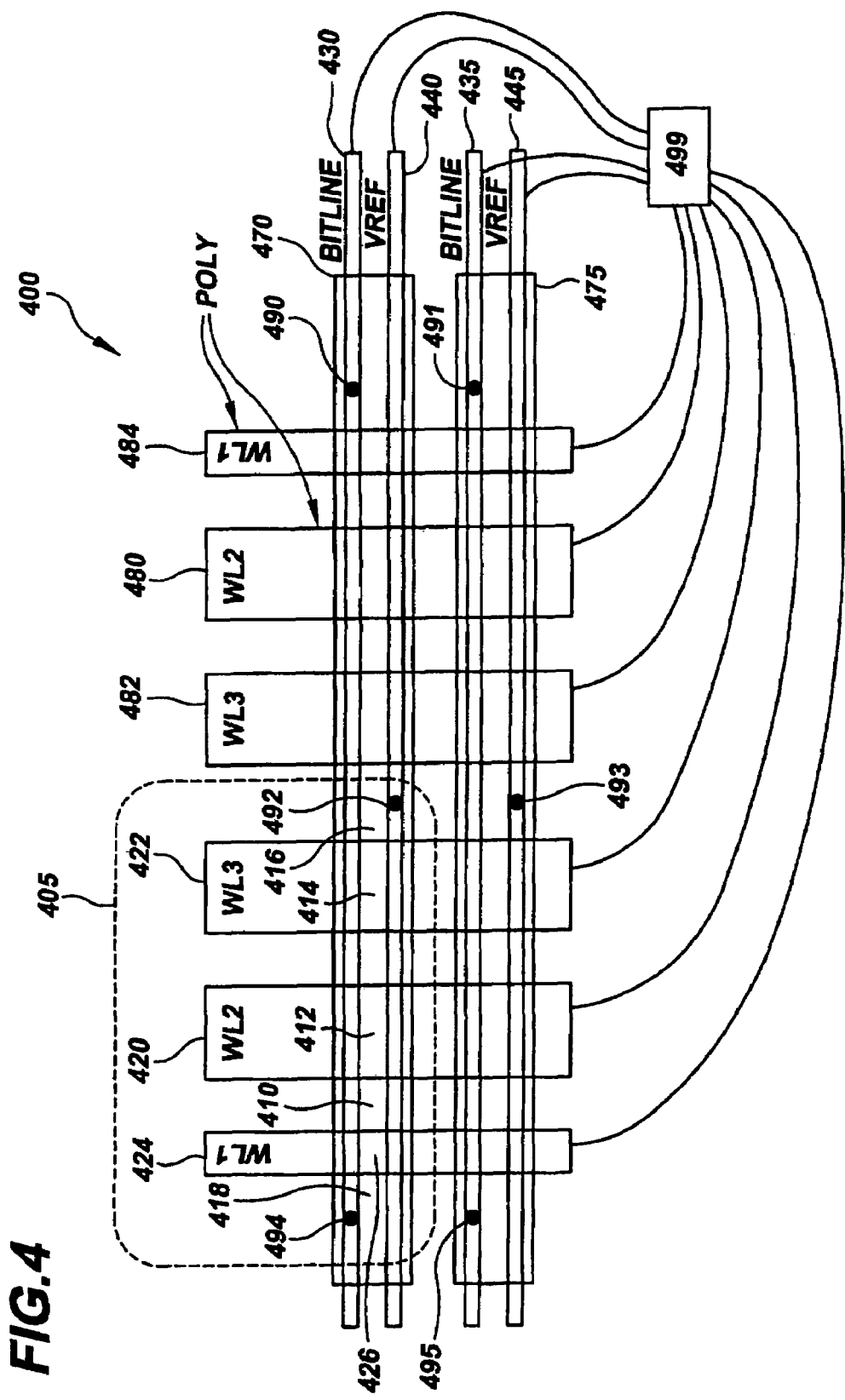
FIG. 4 is a memory array having a thyristor-based memory cell, according to another example embodiment of the present invention.

FIG. 4 is a top-down view of a memory array 400 using a SOI approach and having four thyristor-based devices (e.g., similar to device 200 in FIG. 2), according to another example embodiment of the present invention. The memory array 400 includes active regions 470 and 475 that include various base, emitter, well and source/drain regions (e.g., such as those shown in FIG. 2). First word lines (WL1) 424 and 484 are capacitively coupled to well regions for pass devices, second word lines (WL2) 420 and 480 are capacitively coupled to first thyristor base regions, and third word lines (WL3) 422 and 482 are capacitively coupled to second thyristor base regions. Bit lines 430 and 435 are coupled to source/drain regions of pass devices in the active regions via contacts 490, 491, 494 and 495. Reference voltage (Vref) lines 440 and 445 are adapted to supply a reference voltage (e.g., a same and/or different reference voltage) to emitter regions in the active regions via contacts 492 and 493. By coupling Vref in parallel with the bit lines, as shown, memory cells sharing word lines do not necessarily share a common Vref. This approach is useful, for example, for improving the ability to control write "1"s to a particular cell in a word line. For instance, the write operation can be carried out without mistakenly writing to another cell in the same word line that would receive a Vref pulse, were the interconnects coupled in parallel with the word lines.

Referring specifically to a memory cell region in the array shown by dashed region 405, a first pass device includes source/drain regions 418 and 410, with a control gate 424 (WL1) capacitively coupled to a well region 426 and adapted to switch the pass device to a voltage being applied thereto. The source/drain region 410 also is a first emitter region of a thyristor body, which also includes a first base region 412, a second base region 414 and a second emitter region 416. Bit line contact 494 is coupled to the source/drain region 418, and a reference voltage contact 492 is coupled to the second emitter region 416. The memory cell region 405 may, for example, include the thyristor-based device shown in FIG. 2, with corresponding regions being similarly numbered (e.g., P base region 212 in FIG. 2 corresponds to P base region 412 in FIG. 4).

Figure 5:
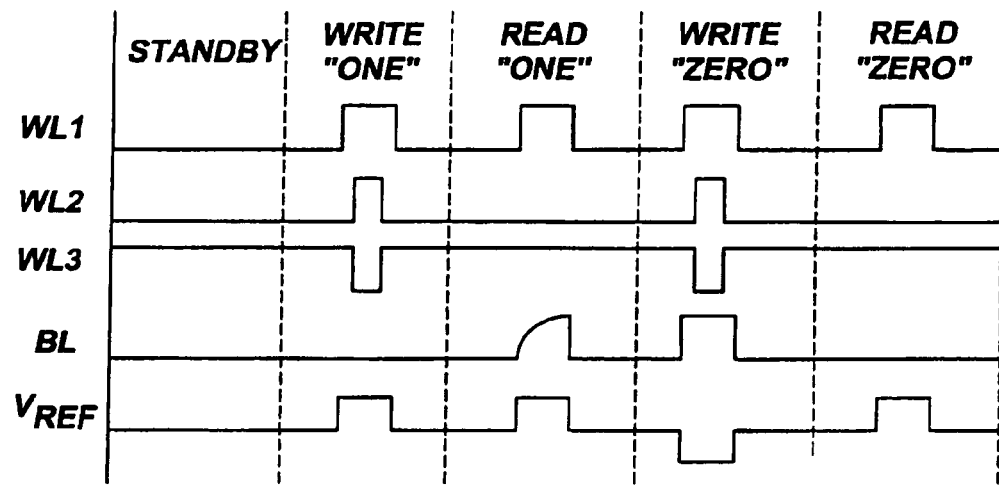
FIG. 5 is a diagram showing operational characteristics of a thyristor-based memory device, according to another example embodiment of the present invention.
Figure 6:
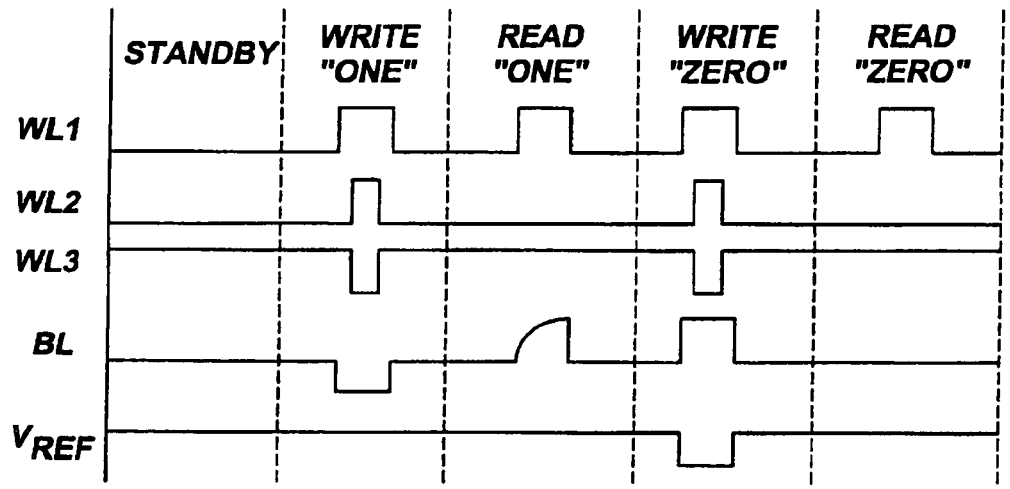
FIG. 6 is another diagram showing operational characteristics of a thyristor-based memory device, according to another example embodiment of the present invention.

In another example, the memory array 400 includes a circuit controller 499 adapted to apply signals to one or more of the various word lines, bit lines and Vref lines, shown coupled to each of these lines. The circuit controller 499 applies signals for controlling the operation of the memory array 400 for storing, reading and writing data using, for example, signals as shown in FIGS. 5 and 6. Referring again to memory cell 405, in one implementation, the circuit controller 499 is adapted for inhibiting the emitter and base regions 416 and 414 from becoming forward biased during a write "zero" operation by applying a low voltage (e.g., below zero) to the Vref line 440. In another implementation, the circuit controller 499 is adapted to apply voltage biases of opposite polarity to the second and third word lines 420 and 422 for controlling current flow in memory cell 405. With these approaches, data is stored and manipulated in the various cells in the memory array 400.

The thyristor-based devices to which the present invention is directed, including those discussed above, can be operated in a variety of manners. In one example embodiment of the present invention, a base region that is adjacent to an emitter region coupled to the reference voltage is pulsed during a write "0" to a voltage that is sufficiently low to prevent the base and emitter from completely clamping a voltage change in the coupled base. Referring to FIG. 2, for example, the base region 214 that is adjacent to emitter region 216 can be pulsed at a low voltage via thyristor gate 222. The reference voltage supplied to the emitter region 216 is lowered to prevent the base and adjacent emitter regions from becoming forward biased, which would prevent the base from going below a selected voltage (e.g., Vref of about −0.8 V) during a write "0." This approach is particularly useful in connection with the memory array 400 shown in FIG. 4, where the Vref interconnects are parallel to the bit lines such that cells coupled to a common word line are not coupled to a common Vref interconnect.

FIG. 5 shows a waveform for operating a thyristor-based device having control ports coupled to first and second base regions of a thyristor and Vref coupled to the emitter of an anode of the thyristor, according to another example embodiment of the present invention. The waveform is applicable, for example, for use in connection with one or more of the thyristor-based devices discussed above. Vref is pulsed high during write "One," read "One," and read "Zero" operations, while WL2 (e.g., the first base region) is pulsed with a positive going voltage and WL3 (e.g., the second base region) is pulsed with a negative going voltage during write operations. The opposite pulsing of WL2 and WL3 is sufficient to switch the thyristor from a blocking state to a conducting state and to effect a write "One" or to switch the thyristor from a conducting state to a blocking state and to affect a write "Zero". A pass device having a gate WL1 is pulsed high for each read and write operation, and the corresponding bit line (BL) voltage is shown rising for a read "One" and held high for a write "Zero."

FIG. 6 shows a waveform applicable to a thyristor-based device having control ports coupled to two base regions, according to a more particular example embodiment of the present invention. FIG. 6 is similar to FIG. 5 but has Vref held high except during a write "Zero," and has the bit line pulsed low (e.g., below ground) during a write "One." By pulsing the bit line low, the voltage level of Vref can be reduced while still effecting the write, making possible lower voltage operation of the device. In addition, by holding Vref low during a write "Zero," the end portion of a thyristor to which the Vref is coupled can be inhibited from becoming forward biased.

Figure 7:
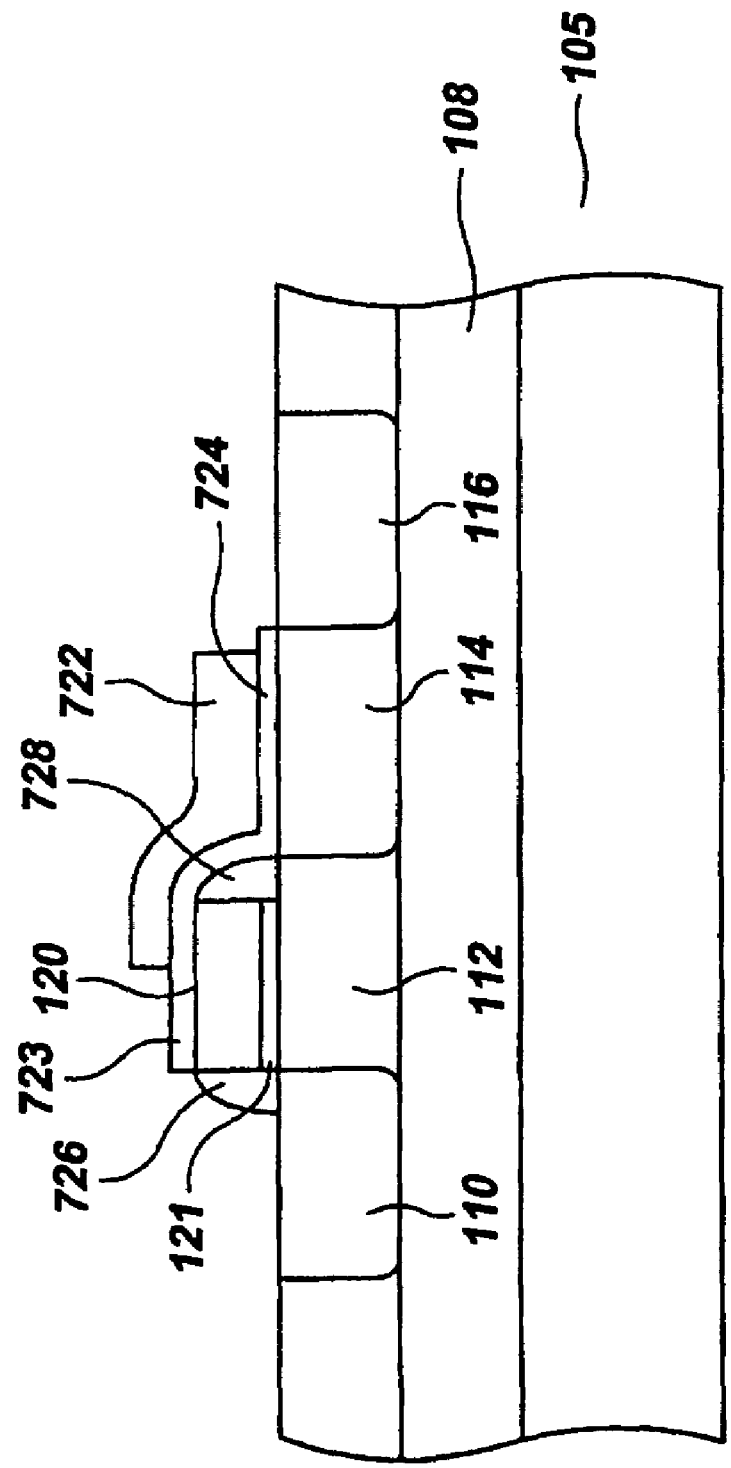
FIG. 7 is a thyristor-based semiconductor device having two control ports, according to another example embodiment of the present invention.

FIG. 7 shows a thyristor-based semiconductor device 700 having two control ports, according to another example embodiment of the present invention. The device 700 is similar to the device 100 shown in FIG. 1, with a second control port 722 being formed over the first control port 120 and separated therefrom by an insulative spacer material 723. A dielectric material 724 separates the second control port 722 from the second base region 114. Spacers 726 and 728 are on opposite sidewalls of the first control port 120, with the first base region 112 being self-aligned to the spacer 728 (e.g., using the spacer to mask a portion of the first base region during implant of the second base region 114). In many applications, such alignment is difficult due to processing limitations and others; with this approach, however, challenges to aligning the control ports over the base regions are addressed.

Figure 8:
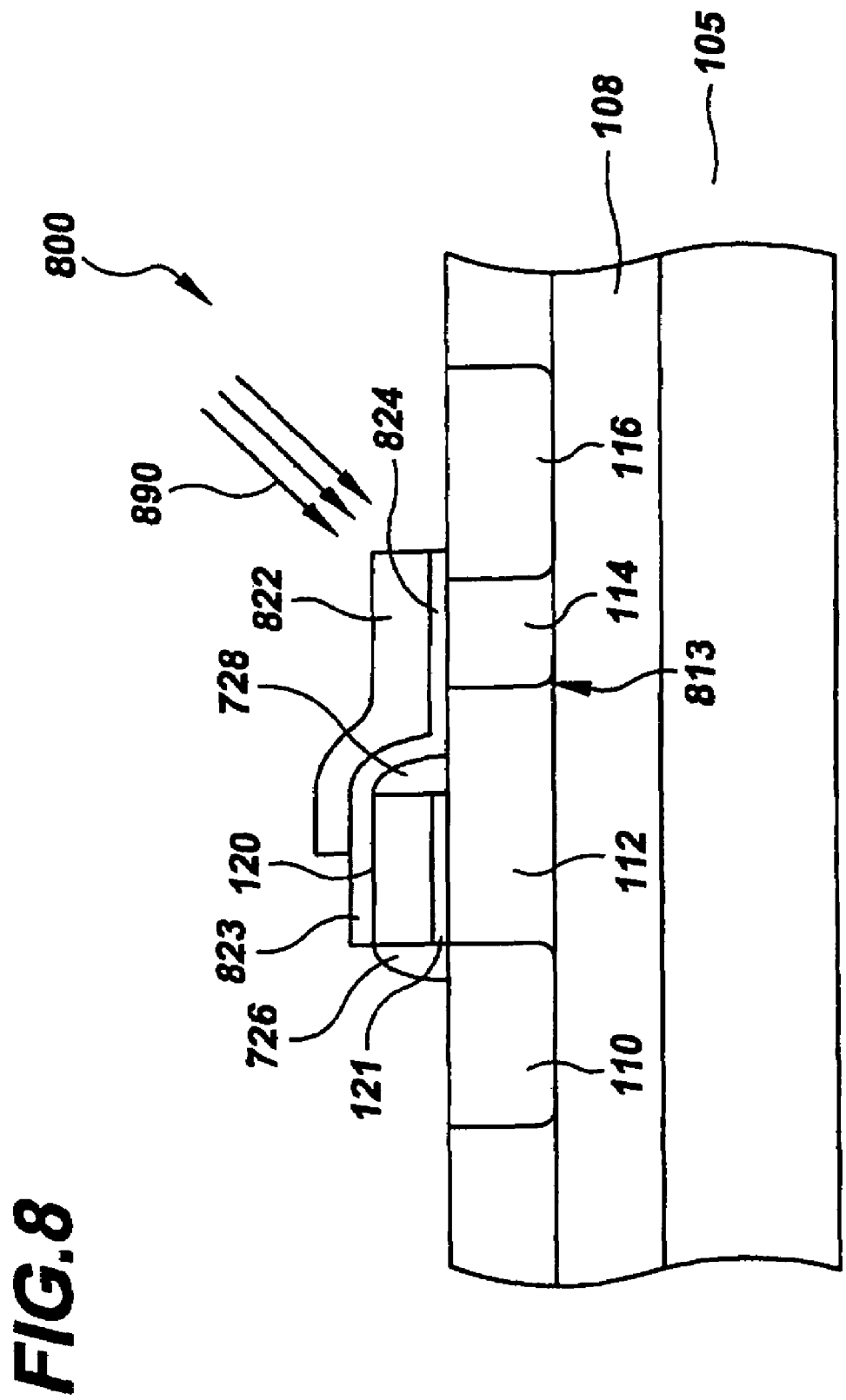
FIG. 8 is a thyristor-based semiconductor device having two control ports and implemented using a high-angle implant, according to another example embodiment of the present invention.

FIG. 8 shows a thyristor-based semiconductor device 800 having two control ports and implemented using a high-angle implant, according to another example embodiment of the present invention. The approach shown in FIG. 8 is similar to the approach shown in FIG. 7, with the spacer material 823 separating a second control port 822 from the first control port 120, and a dielectric material 824 separating the second control port from the second base region 114. In this approach, the second base region 114 is implanted using a high-angle implant, represented by arrows 890, with material over the second base region used as a mask. The second base region 114 is thus laterally recessed from the sidewall of the second control port 822 toward which the angled implant 890 is directed, resulting in the second control port overlapping a junction 813 between the first base region 112 and the second base region 114. This approach has also been found useful, for example, for forming the first base region 112 with a lesser dopant concentration than the second base region 114.

Figure 9:
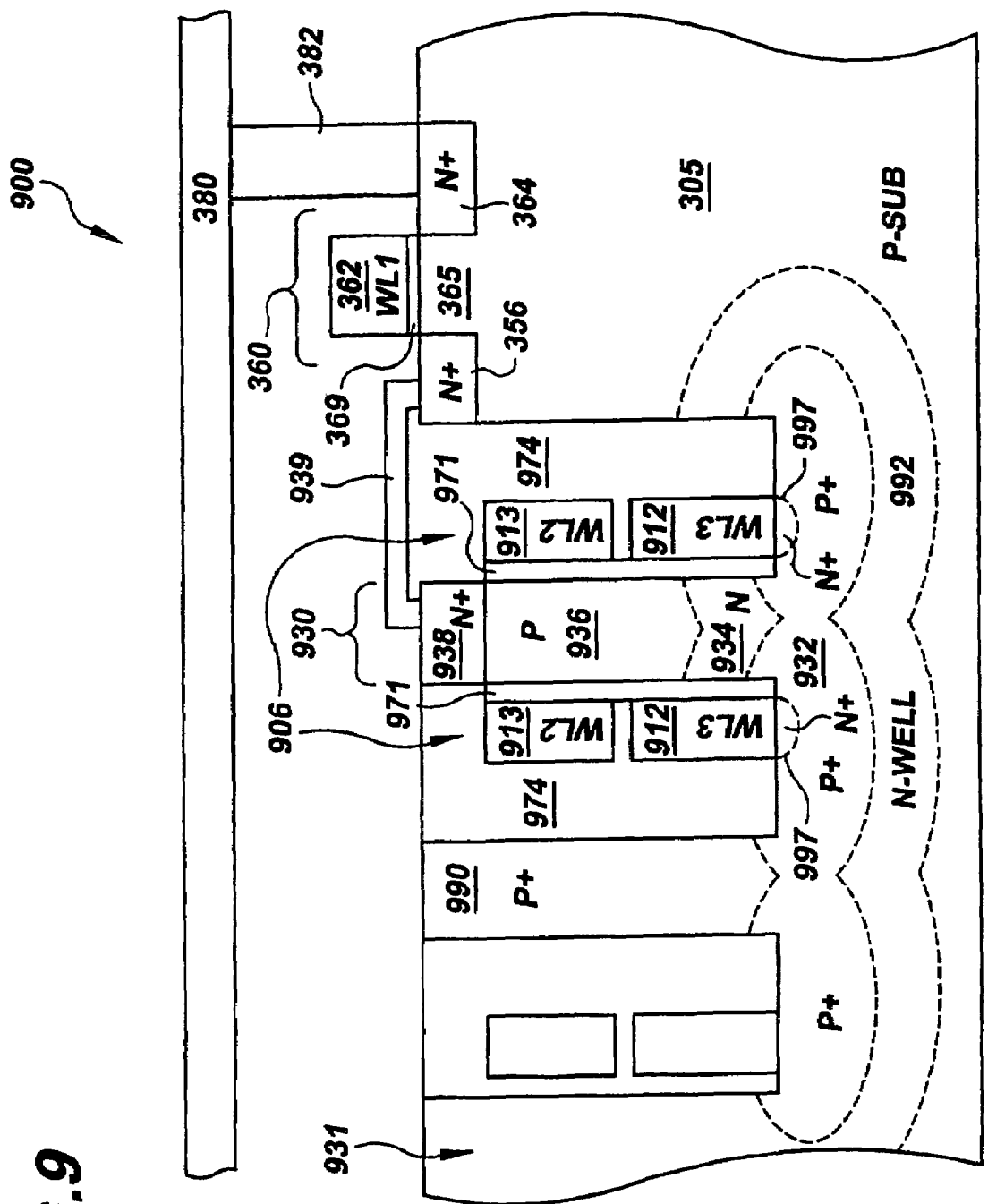
FIG. 9 shows a thyristor-based semiconductor device with a carrier isolation approach, according to another example embodiment of the present invention.

FIG. 9 shows a thyristor-based semiconductor device 900 with a carrier isolation approach, according to another example embodiment of the present invention. The device 900 has certain characteristics similar to and labeled consistently with similar characteristics shown in FIG. 3. In this implementation, a thyristor body 930 is arranged with a P+ anode end portion at a lower end thereof, and an N+ cathode end portion near an upper surface of bulk substrate 305. An N-well region 992 is implanted via the bottom of filled trench 906 (e.g., prior to filling the trench) that extends at least partially around the thyristor body 930. The N-well implant also forms N base region 934. P+ anode emitter region 932 is implanted via the bottom of filled trench 906 and in the N-well region 992. An N+ emitter region 938 is implanted at an upper portion of the thyristor body 930, leaving remaining P base region 936 between the N+ emitter and the N base region 934. In one implementation, N+ emitter region 938 is implanted concurrently with N+ source/drain regions 356 and 364. Control ports 912 and 913 are disposed in the trench 906 and separated from the thyristor body 930 by dielectric material 971, with insulative material 974 filling a remaining portion of the trench.

An interconnect 939 electrically couples the N+ emitter region 938 with the N+ source/drain region 356. A P+ anode contact 990 is coupled to the P+ emitter region 932 and extends to an upper portion of the substrate 305 for making contact to the P+ emitter region (e.g., for facilitating contact to a reference voltage). Control port 913 is capacitively coupled to the P base region 936 and control port 912 is capacitively coupled to the N base region 934 and also overlaps a junction between the P base and N base region. Minority carrier isolation region 997 extends below the second control port and is adapted for inhibiting minority carriers from passing to adjacent circuitry (e.g., another thyristor body 931). In one implementation, the minority carrier isolation region 997 is formed via diffusion from the control port 912. For general information regarding semiconductor devices and for specific information regarding carrier isolation approaches that may be implemented in connection with one or more example embodiments of the present invention, reference may be made to U.S. Provisional Patent Application Ser. No. 60/415,356, filed on Oct. 1, 2002 and entitled "Novel Minority Carrier Isolation Device," which is fully incorporated herein by reference.

In each of the above operational examples and in the examples shown in the figures, many variations in the waveforms are within the scope of the present invention. For example, the timing of the waves can change, such as by raising the bit line voltage or the WL2 voltage during a write "One" before or after the WL1 voltage is raised. In addition, the WL3 voltage can be lowered with the corresponding rise of the WL2 voltage so that the thyristor is switched from a blocking state into a conducting state and that the write is effected.

As discussed above, the present invention is applicable to a variety of types of thyristors and thyristor-based devices. For more information regarding thyristor-based devices in general, and in specific application to those that can be used in connection with control ports coupled to both base regions of a thyristor as the present invention is directed, reference may be made to U.S. patent application Ser. Nos. 10/023,052, entitled "THYRISTOR-BASED DEVICE OVER SUBSTRATE SURFACE," now U.S. Pat. No. 6,653,174 filed on Dec. 17, 2001, Ser. No. 09/815,213, entitled "THYRISTOR-BASED DEVICE INCLUDING TRENCH ISOLATION," now U.S. Pat. No. 6,727,528 filed on Mar. 22, 2001 and 10/238,571, entitled "INLAYED THYRISTOR-BASED DEVICE," now U.S. Pat. No. 6,790,713 filed on Sep. 9, 2002, all of which are fully incorporated herein by reference.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of p-n sections in the thyristor-based memory device; and interchanging P and N regions in the device structures and/or using PMOSFETS or NMOSFETS in connection with the thyristors. In addition, for more information regarding implementations to which one or more example embodiments of the present invention is applicable, and for further information regarding the construction and operation of aspects of one or more of these example embodiments, reference may be made to U.S. Pat. No. 6,229,161, which is fully incorporated herein by reference. Such modifications and changes do not depart from the true spirit and scope of the present invention that is set forth in the following claims.

What is claimed is:

1. A method for manufacturing a semiconductor device having adjacent thyristor body regions in a substrate, the thyristor body regions being oppositely doped and having a junction therebetween, the method comprising:
   etching a trench in a substrate;
   lining the trench with an insulative material;
   forming conductive material in the trench, separated from a first one of the thyristor body regions by the insulative material and extending above the junction;
   etching a portion of the semiconductor device including the conductive material in the trench; and
   detecting a characteristic of the material being etched and controlling the etching as a function of the detected characteristic;
   wherein detecting a characteristic of the material being etched includes detecting that the conductive material has been etched to a depth that is aligned with the junction.

2. The method of claim 1, wherein detecting a characteristic of the material being etched includes detecting the composition of material being sputtered from the semiconductor device.

3. The method of claim 2, wherein etching a portion of the semiconductor device includes etching a portion of the junction, wherein detecting a characteristic of the material being etched includes detecting that the junction is being etched and wherein controlling the etching as a function of the detected characteristic includes stopping the etching in response to detecting that the junction is being etched.

4. The method of claim 3, further comprising:
   forming an insulative material over the etched conductive material in the trench; and
   forming a additional conductive material in the trench, said conductive material and additional conductive material forming first and second control ports each adapted for capacitively coupling to the first and second body regions, respectively.

5. The method of claim 2, further comprising implanting the adjacent thyristor body regions while concurrently implanting a dummy portion of the semiconductor device having the junction at the same depth as the junction between the thyristor body regions, wherein etching a portion of the semiconductor device includes etching the dummy portion of the device and wherein detecting a characteristic of the material being etched and controlling the etching includes detecting that the junction in the dummy region has been etched and stopping the etching in response to detecting that the junction in the dummy portion has been reached.

6. A method for manufacturing a semiconductor device having a substrate and a thyristor, the method comprising:
   implanting a first region of the substrate;
   forming a first control port over the first region and configured and arranged to capacitively couple a first signal to at least the first region;
   masking a portion of the substrate at least under the first control port and implanting a second region of the substrate laterally adjacent to the first region;
   forming a second control port over the substrate including the second region, the second control port being configured and arranged to capacitively couple a second signal to at least the second region of the substrate, wherein the thyristor is adapted to switch between a blocking state and a conducting state in response to the first and second signals; and masking a portion of the substrate at least including a portion of the first and second regions and implanting a third region of the substrate laterally adjacent to the second region and separated from the first region by the second region.

7. The method of claim 6, wherein masking a portion of the substrate at least under the first control port and implanting a second region of the substrate includes using the first control port as a mask and aligning a junction between the first and second regions to the mask.

8. The method of claim 6, wherein masking a portion of the substrate at least under the first control port and implanting a second region of the substrate includes using the first and second control ports as a mask and using an angled implant to implant the second region under the second control port.

9. The method of claim 6, wherein implanting a third region of the substrate laterally adjacent to the second region includes using the second control port as a mask and aligning a junction between the second and third regions to the mask.

* * * * *